United States Patent
Kim et al.

(10) Patent No.: US 10,699,378 B2
(45) Date of Patent: Jun. 30, 2020

(54) APPARATUS AND METHOD FOR ACQUIRING IMAGE

(71) Applicant: SAMSUNG ELECTRONICS CO., LTD., Suwon-si (KR)

(72) Inventors: Yunhee Kim, Seoul (KR); Sookyoung Roh, Seoul (KR); Sunghyun Nam, Yongin-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 252 days.

(21) Appl. No.: 15/295,248

(22) Filed: Oct. 17, 2016

(65) Prior Publication Data

US 2017/0109865 A1    Apr. 20, 2017

(30) Foreign Application Priority Data

Oct. 15, 2015    (KR) .................. 10-2015-0144320

(51) Int. Cl.
  *H04N 5/349*    (2011.01)
  *G02B 5/20*    (2006.01)
  (Continued)

(52) U.S. Cl.
  CPC .......... *G06T 3/4069* (2013.01); *G02B 3/0006* (2013.01); *G02B 5/06* (2013.01);
  (Continued)

(58) Field of Classification Search
  CPC ........ H04N 5/349; H04N 9/646; H04N 9/045; H04N 13/0217; H04N 2209/045;
  (Continued)

(56) References Cited

U.S. PATENT DOCUMENTS 9,042,028 B2    5/2015  Choi et al.
2006/0279857 A1*  12/2006  Levola ............... G02B 13/0065
                                                359/832
(Continued)

FOREIGN PATENT DOCUMENTS

JP    5-7366 A    1/1993
JP    6-139340 A    5/1994
(Continued)

OTHER PUBLICATIONS

Okia Yoshida et al; "Image Flicker Control by CCD-Chip-Shift and Wobble Operation at Double-Enhanced Nyquist Regions"; IEEE Transactions on Electron Devices; vol. ED-32; No. 8; Aug. 1985; pp. 1505-1510.

*Primary Examiner* — Lin Ye
*Assistant Examiner* — John H Morehead, III
(74) *Attorney, Agent, or Firm* — Sughrue Mion, PLLC

(57) ABSTRACT

An image acquisition apparatus includes a color filter on which a plurality of types of color filter elements are arranged, an optical path modulation optical element configured to shift an incident position of an image on the color filter by electrically modulating an optical path of the image, and a photoelectric conversion cell array configured to acquire image information for each color by detecting, in pixel units, light which has passed through the color filter. A color image is obtained by acquiring, in a time division manner, the image information for each color of the image of which a position is changed by the optical path modulation optical element by using a detection signal of the photoelectric conversion cell array, and combining the acquired image information for each color.

20 Claims, 23 Drawing Sheets

(51) Int. Cl.
*G02B 5/06* (2006.01)
*H04N 9/04* (2006.01)
*H04N 9/64* (2006.01)
*G06T 3/40* (2006.01)
*H04N 13/218* (2018.01)
*G02B 3/00* (2006.01)
*G02B 26/00* (2006.01)
*H01L 27/146* (2006.01)
*H04N 13/232* (2018.01)

(52) U.S. Cl.
CPC ........... *G02B 5/201* (2013.01); *G02B 26/005* (2013.01); *G06T 3/4015* (2013.01); *H01L 27/14621* (2013.01); *H01L 27/14645* (2013.01); *H04N 5/349* (2013.01); *H04N 9/045* (2013.01); *H04N 9/646* (2013.01); *H04N 13/218* (2018.05); *H04N 13/232* (2018.05); *H04N 2209/045* (2013.01)

(58) Field of Classification Search
CPC ...... G02B 5/06; G02B 26/005; G02B 3/0006; G02B 3/12; G02B 3/14; H01L 27/14645; H01L 27/14621; G06T 3/4015
See application file for complete search history.

(56) References Cited

U.S. PATENT DOCUMENTS

| | | | |
|---|---|---|---|
| 2007/0188676 A1* | 8/2007 | Choi | G02B 3/14 349/62 |
| 2008/0100905 A1* | 5/2008 | Kato | G02B 3/14 359/295 |
| 2009/0122417 A1* | 5/2009 | Hou | G02B 3/14 359/665 |
| 2011/0063289 A1* | 3/2011 | Gantz | G03H 1/02 345/419 |
| 2011/0122467 A1* | 5/2011 | Futterer | G02F 1/133524 359/9 |
| 2011/0292258 A1* | 12/2011 | Adler | G02B 23/2423 348/263 |
| 2012/0154939 A1* | 6/2012 | Yamazaki | G02B 5/06 359/832 |
| 2012/0287493 A1* | 11/2012 | Kuhlman | B60Q 1/085 359/228 |
| 2013/0208175 A1* | 8/2013 | Ono | G02B 3/14 348/344 |
| 2014/0168754 A1* | 6/2014 | Kim | G02B 30/36 359/316 |
| 2014/0285862 A1* | 9/2014 | Song | G02B 5/32 359/16 |
| 2014/0300711 A1* | 10/2014 | Kroon | H04N 13/144 348/51 |
| 2014/0354777 A1 | 12/2014 | Lee et al. | |
| 2015/0124114 A1 | 5/2015 | Kamiya et al. | |
| 2015/0156478 A1* | 6/2015 | Ono | H04N 5/2251 348/49 |
| 2015/0286033 A1* | 10/2015 | Osborne | G03B 17/17 348/345 |
| 2015/0338636 A1* | 11/2015 | Choi | G02B 26/005 359/290 |
| 2015/0371577 A1* | 12/2015 | Hosaka | G09G 3/007 345/56 |

FOREIGN PATENT DOCUMENTS

| | | |
|---|---|---|
| KR | 10-2014-0058274 A | 5/2014 |
| KR | 10-2014-0140495 A | 12/2014 |

* cited by examiner

APPARATUS AND METHOD FOR ACQUIRING IMAGE

CROSS-REFERENCE TO RELATED APPLICATION

This application claims priority from Korean Patent Application No. 10-2015-0144320, filed on Oct. 15, 2015, in the Korean Intellectual Property Office, the disclosure of which is incorporated herein in its entirety by reference.

BACKGROUND

1. Field

Apparatuses and methods consistent with exemplary embodiments relate to apparatuses and methods for acquiring an image, and more particularly, to image acquisition apparatuses and methods capable of acquiring high-resolution color image information.

2. Description of the Related Art

A color filter in an image sensor is an element needed to acquire color information of an image. In most color image sensors, an organic dye-type color filter through which only specific color of red (R), green (G), and blue (B) lights passes is located on a detector for photoelectric conversion for each pixel in an arrangement called a Bayer pattern, and an original color image is restored through image processing after obtaining an image in a color mosaic scheme through such Bayer color filters.

A color filter applied to image sensors and the like to acquire a color image uses a scheme of obtaining color information of an image by spatially separating colors, and thus, resolution of information for each color is reduced.

For example, in case of a Bayer color filter, resolution of information for each color is reduced to one fourth of the number of detectors (for R or B color) or by a half thereof (for G color). When a Bayer color filter is applied, since information about R and B colors is obtained for each basic unit forming a Bayer pattern, i.e., a unit of 2 pixels×2 pixels, information corresponding to a half of the number of detectors is obtained in each of horizontal and vertical directions, and thus resolution corresponding to one fourth of the total number of detectors is obtained for each of R and B colors. Since information about a G color is obtained from two pixels in a unit of 2 pixels×2 pixels, resolution of the G color is two times the resolution of the R or B color, but information about the G color cannot be obtained from R and B regions yet, and resolution corresponding to a half of the total number of detectors is obtained for the G color.

SUMMARY

Provided are an image acquisition apparatus and an image acquisition method capable of acquiring a high-resolution color image by applying an optical path modulation optical element to shift an optical path of an image.

Additional aspects will be set forth in part in the description which follows and, in part, will be apparent from the description, or may be learned by practice of the presented exemplary embodiments.

According to an aspect of an exemplary embodiment, an image acquisition apparatus includes: a color filter on which a plurality of types of color filter elements are arranged; an optical path modulation optical element configured to shift an incident position of an image on the color filter by electrically modulating an optical path; a photoelectric conversion cell array configured to acquire image information for each color by detecting, in pixel units, light which has passed through the color filter; and a signal processor configured to acquire, in a time division manner, the image information for each color of the image of which a position is changed by the optical path modulation optical element by using a detection signal of the photoelectric conversion cell array, and configured to obtain a color image by combining the acquired image information for each color.

The optical path modulation optical element may be further configured to shift the incident position of the image on the color filter in one pixel unit, and the signal processor may be further configured to acquire, in the time division manner, the image information for each color of the image of which a position is changed in one pixel unit by the optical path modulation optical element.

The image acquisition apparatus may further include a driver configured to electrically drive the optical path modulation optical element such that the position of the image is changed on the color filter in the time division manner.

The optical path modulation optical element may be an electrowetting prism of which an inclination angle of an interface between a first fluid and a second fluid is controlled by an applied voltage.

An incident surface and an exit surface of the electrowetting prism may be parallel to each other.

The electrowetting prism may include first and second electrowetting prisms, each provided with the first and second fluids, and the first and second electrowetting prisms may be arranged along a traveling direction of the light such that one of the first or second fluids of the first electrowetting prism and one of the first or second fluids of the second electrowetting prism, having a same refractive index, are close to each other.

When an interface between the first and second fluids in the first electrowetting prism is a first interface, and an interface between the first and second fluids in the second electrowetting prism is a second interface, the first interface and the second interface may be parallel to each other.

The optical path modulation optical element may include at least one active liquid crystal element configured to shift the light according to an applied voltage.

The active liquid crystal element may include a first active liquid crystal element disposed along the traveling direction of the light and configured to refract the light according to the applied voltage.

The active liquid crystal element may include first and second active liquid crystal elements disposed to be spaced apart from each other along the traveling direction of the light and configured to shift the light according to the applied voltage.

The active liquid crystal element may include at least one of a hologram-type liquid crystal element and a beam-steering liquid crystal element.

The image acquisition apparatus may further include a main lens, wherein the optical path modulation optical element is located between the main lens and the color filter.

The image acquisition apparatus may further include a microlens array between the main lens and the color filter to acquire information of the image corresponding to each direction.

The optical path modulation optical element may be located between the main lens and the microlens array to entirely cover the microlens array.

The optical path modulation optical element may be located between the microlens array and the color filter, and an array of a plurality of optical path modulation optical elements may be provided to one-to-one correspond to microlenses in the microlens array.

The color filter may include at least one of a two-dimensional (2D) arrangement of color filter element basic units, each including two green filter elements, one blue filter element, and one red filter element arranged in a Bayer pattern, a 2D arrangement of color filter element basic units, each including one red filter element, one green filter element, one blue filter element, and one white element, a 2D arrangement of color filter element basic units, each including one red filter element, one green filter element, and one blue filter element, a 2D arrangement of color filter element basic units, each including one yellow filter element, one magenta filter element, one cyan filter element, and one white element, and a 2D arrangement of color filter element basic units, each including one yellow filter element, one magenta filter element, and one cyan filter element.

In response to the image shifted by the optical path modulation optical element having a position change amount of p, the optical path modulation optical element may be further configured to acquire the image information for each color from a plurality of positions in the time division manner by shifting the image by p in at least one of x-axial and y-axial directions, and the signal processor may be further configured to obtain the color image by combining the image information for each color, which has been acquired from the plurality of positions in the time division manner.

According to an aspect of another exemplary embodiment, an image acquisition method includes: electrically controlling an optical path modulation optical element to shift an incident position of an image on a color filter on which a plurality of types of color filter elements are arranged; acquiring image information for each color by detecting, in pixel units, light which has passed through the color filter by using a photoelectric conversion cell array; acquiring, in a time division manner, image information for each color from a plurality of positions by using the photoelectric conversion cell array while changing a position of the image on the color filter at least once by using optical path modulation according to the electrical control of the optical path modulation optical element; and acquiring a color image by combining the image information for each color which is acquired in the time division manner from the plurality of positions.

The optical path modulation optical element may shift the incident position of the image on the color filter in one pixel unit.

In response to the image shifted by the optical path modulation optical element having a position change amount of p, the image information for each color may be acquired from a plurality of positions in the time division manner by shifting the image by p in at least one of x-axial and y-axial directions by using the optical path modulation optical element, and the color image may be acquired by combining the acquired image information.

BRIEF DESCRIPTION OF THE DRAWINGS

The above and/or other aspects will become apparent and more readily appreciated from the following description of exemplary embodiments, taken in conjunction with the accompanying drawings, in which.

DETAILED DESCRIPTION

Figure 1:
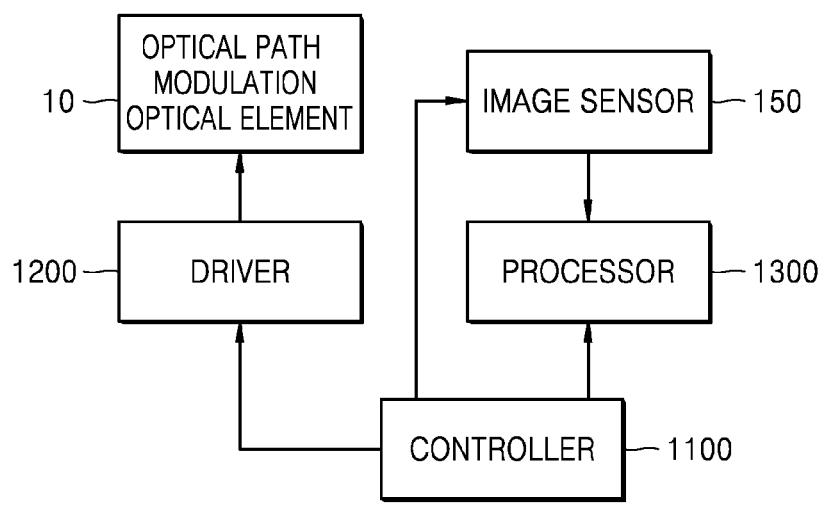
FIG. 1 illustrates a block diagram of an image acquisition apparatus according to an exemplary embodiment.

An image acquisition apparatus and method according to exemplary embodiments will now be described in detail with reference to the accompanying drawings. In the drawings, like reference numerals refer to like elements, and the thicknesses of layers and regions may be exaggerated for clarity. In this regard, the present exemplary embodiments may have different forms and should not be construed as being limited to the descriptions set forth herein. Accordingly, the exemplary embodiments are merely described below, by referring to the figures, to explain aspects. In the description below, when it is described that a certain layer is provided "on", "on an upper part of", or "above" a substrate or another layer, the certain layer may be in direct contact with and above the substrate or another layer, or a third layer may be interposed therebetween. As used herein, expressions such as "at least one of," when preceding a list of elements, modify the entire list of elements and do not modify the individual elements of the list.

Figure 2:
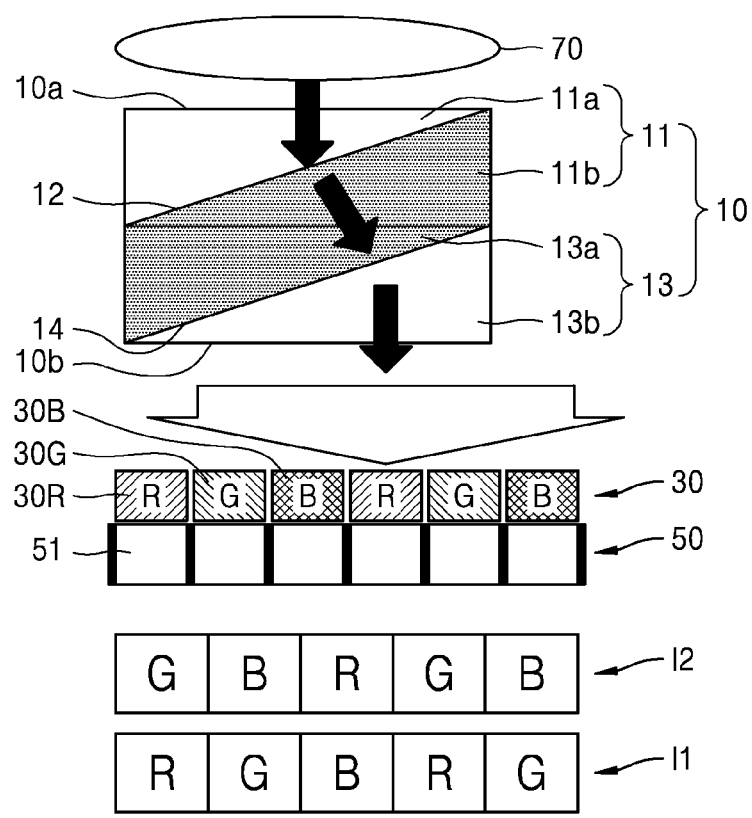
FIG. 2 illustrates an optical configuration applied to the image acquisition apparatus of FIG. 1, according to an exemplary embodiment.

FIG. 1 illustrates a block diagram of an image acquisition apparatus according to an exemplary embodiment. FIG. 2 illustrates an optical configuration applied to the image acquisition apparatus of FIG. 1, according to an exemplary embodiment.

Referring to FIGS. 1 and 2, the image acquisition apparatus may include an optical path modulation optical element 10, an image sensor 150, and a signal processor 1300. The optical path modulation optical element 10 may be turned on or off based on a voltage applied from a driver 1200. The image sensor 150 may include a color filter 30 and a photoelectric conversion cell array 50. The driver 1200 may electrically drive the optical path modulation optical element 10 to change a position of an image on the color filter 30 in a time division manner. The image sensor 150, the driver 1200, and the signal processor 1300 may be controlled by a controller 1100.

Referring to FIG. 2, the image acquisition apparatus may further include a main lens 70 configured to form an image of a subject. Herein, the color filter 30, the photoelectric conversion cell array 50, and the optical path modulation optical element 10 may form the image sensor 150. In addition, the driver 1200 and the signal processor 1300 may also be included in the image sensor 150. That is, the image sensor 150 may include the remaining components except for lens elements such as the main lens 70. Accordingly, components of the image sensor 150 are not limited to the color filter 30 and the photoelectric conversion cell array 50 and may include some components of the image acquisition apparatus. FIGS. 1 and 2 show a case where the image sensor 150 includes the color filter 30 and the photoelectric conversion cell array 50.

According to the image acquisition apparatus according to the present exemplary embodiment, the optical path modulation optical element 10 may be configured to be capable of electrically controlling an optical path such that an optical axis of an image output from the main lens 70 is moved or returned to a certain position, e.g., one pixel, on the color filter 30 according to an electrical signal. The optical path modulation optical element 10 may be driven by the driver 1200 so as to change a position of an image on the color filter 30 in a time division manner.

The optical path modulation optical element 10 may be configured such that an incident surface 10a and an exit surface 10b are parallel to each other. For example, an electrowetting prism having a quick response speed may be applied to the optical path modulation optical element 10. In the image acquisition apparatus according to the present exemplary embodiment, the electrowetting prism may be configured such that incident and exit surfaces are parallel to each other and an inclination angle of an interface between first and second fluids having different refractive indices is controlled by an applied voltage. In this case, the electrowetting prism may be configured such that an incident position of an image on the color filter 30 is changed in at least one of, for example, horizontal and vertical directions by adjusting the inclination angle of the interface between the first and second fluids. By doing this, an incident position of an image may be shifted or returned in at least one of the horizontal and vertical directions in pixel units by electrically controlling the electrowetting prism.

The optical path modulation optical element 10 may include, for example, first and second electrowetting prisms 11 and 13, each provided with a first fluid 11a or 13b and a second fluid 11b or 13a, as shown in FIG. 2. The first and second electrowetting prisms 11 and 13 may be arranged along a traveling direction of light such that the first fluids 11a and 13b or the second fluids 11b and 13a having a same refractive index are close to each other. FIG. 2 shows a case where the first and second electrowetting prisms 11 and 13 are arranged such that the second fluids 11b and 13a of the first and second electrowetting prisms 11 and 13 are close to each other. In this case, when an interface between the first fluid 11a and the second fluid 11b of the first electrowetting prism 11 is a first interface 12, and an interface between the first fluid 13b and the second fluid 13a of the second electrowetting prism 13 is a second interface 14, the first interface 12 and the second interface 14 may be parallel to each other.

As described above, when the optical path modulation optical element 10 includes the first and second electrowetting prisms 11 and 13, light incident to the optical path modulation optical element 10 and light output from the optical path modulation optical element 10 may be parallel to each other. In this case, the incident surface 10a of the optical path modulation optical element 10 corresponds to an incident surface of the first electrowetting prism 11, and the exit surface 10b of the optical path modulation optical element 10 corresponds to an exit surface of the second electrowetting prism 13.

The color filter 30 may have an arrangement of a plurality of types of filter elements 30R, 30G, and 30B. For example, in the color filter 30, an R filter element 30R, a G filter element 30G, and a B filter element 30B may be arranged to form a two-dimensional (2D) array in pixel units, wherein each of the R, G, and B filter elements 30R, 30G, and 30B corresponds to each color pixel in the image sensor 150. For example, the color filter 30 may have a 2D arrangement of a color filter element basic unit including two G filter elements 30G, one B filter element 30B, and one R filter element 30R arranged in a Bayer pattern. Additionally, the color filter 30 may have arrangements in which a plurality of types of color filter elements are variously arranged. For example, the color filter 30 may have a 2D arrangement of a color filter element basic unit including R, G, B, and W filter elements. Herein, the W filter element indicates white color and may correspond to a transparent pixel with no filter element. As another example, the color filter 30 may have a 2D arrangement of a color filter element basic unit including cyan (C), magenta (M), yellow (Y), and black (K) filter elements. As described above, the color filter 30 may have various sets of color filter elements, and accordingly, the image sensor 150 may have various color pixel sets. Hereinafter, a case where the color filter 30 includes the R filter element 30R, the G filter element 30G, and the B filter element 30B is illustrated, but the present embodiment is not limited thereto.

The photoelectric conversion cell array 50 is configured to acquire image information for each color by detecting, in pixel units, light which has passed through the color filter 30, and each photoelectric conversion cell 51 may be configured to one-to-one correspond to each color filter element 30R, 30G, or 30B in the color filter 30. For example, a photoelectric conversion cell 51 corresponding to an R filter element 30R may detect R image information, a photoelectric conversion cell 51 corresponding to a G filter element 30G may detect G image information, and a photoelectric conversion cell 51 corresponding to a B filter element 30B may detect B image information.

For example, when the color filter 30 has a 2D array of the R filter element 30R, the G filter element 30G, and the B filter element 30B, the image sensor 150 may have a 2D array arrangement of an R pixel, a G pixel, and a B pixel. As another example, when the color filter 30 has a Bayer pattern arrangement of which a basic unit includes one R filter element 30R, two G filter elements 30G, and one B filter element 30B, the image sensor 150 may have a 2D array arrangement of color pixels of which a basic unit includes one R pixel, two G pixels, and one B pixel.

FIGS. 2 and 3A through 8B illustratively show a case where the color filter elements 30R, 30G, and 30B in the color filter 30 and corresponding image information for each color are formed in an arrangement of R, G, B, R, G, B, . . . for convenience of explanation. When the color filter elements 30R, 30G, and 30B in the color filter 30 are arranged in the Bayer pattern as shown in FIG. 9, an arrangement of image information for each color also follows the Bayer pattern.

As described above, a configuration and arrangement of a plurality of color filters 30R, 30G, and 30B in the color filter 30 and a corresponding configuration and arrangement of color pixels in the image sensor 150 may be variously modified.

The image information for each color in the photoelectric conversion cell array 50 is processed by the signal processor 1300. The signal processor 1300 acquires, in a time division manner, image information for each color of an image of which a position is changed in one pixel unit by the optical path modulation optical element 10 by using a detection signal of each photoelectric conversion cell 51 of the photoelectric conversion cell array 50 and acquires a color image by combining the acquired image information for each color. The acquired color image may be restored to an original color image through image processing.

Figure 3A:
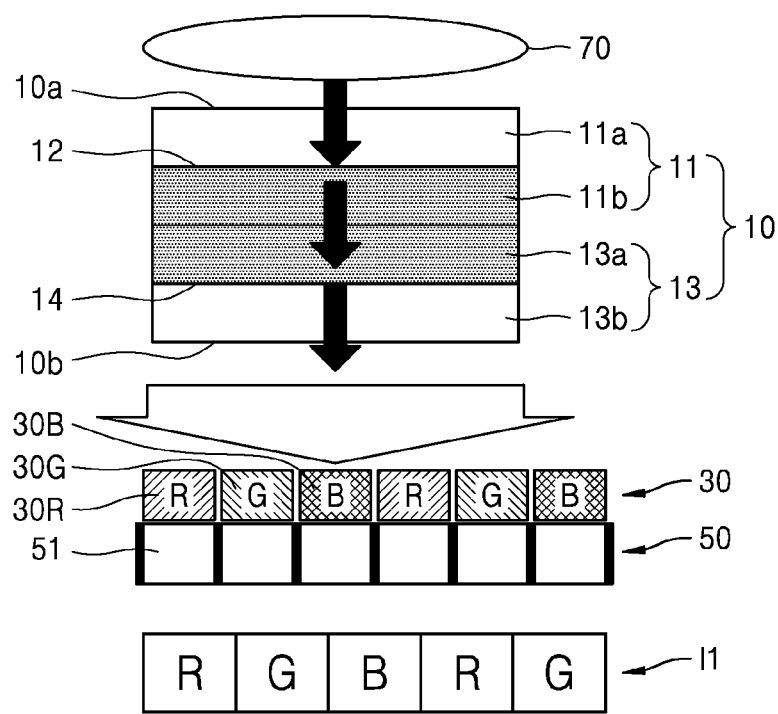
FIGS. 3A and 3B illustrate an operating principle of the image acquisition apparatus of FIG. 2.
Figure 3B:
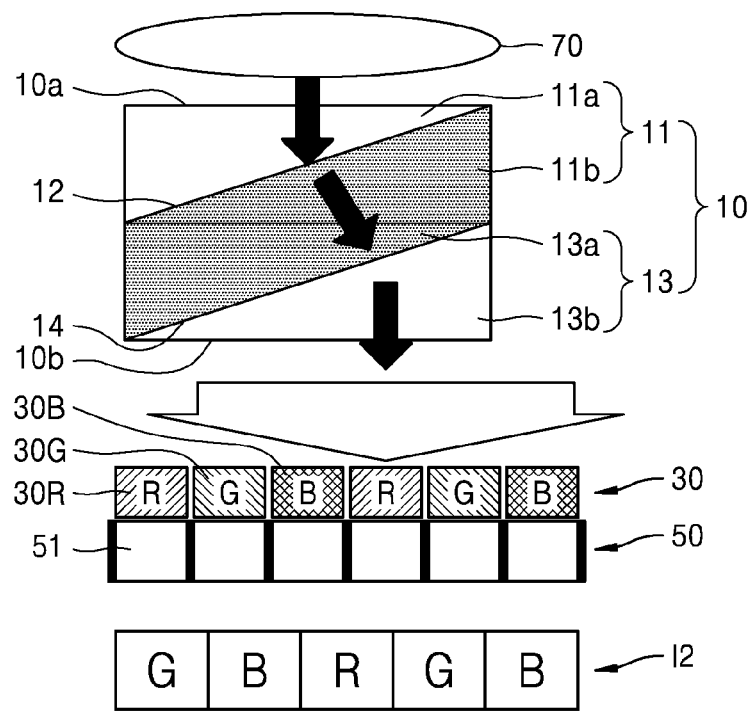

FIGS. 3A and 3B illustrate an operating principle of the image acquisition apparatus of FIG. 2. As shown in FIGS. 3A and 3B, a position of image information for each color may be changed by one pixel by the optical path modulation optical element 10.

For example, when a white image is input to R, G, B, R, and G filter elements 30R, 30G, 30B, 30R, and 30G in the color filter 30, if the optical path modulation optical element 10 is not used, a color image which has passed through the R, G, B, R, and G filter elements 30R, 30G, 30B, 30R, and 30G may be detected as color image information I1 of an R, G, B, R, and G arrangement by corresponding photoelectric conversion cells 51.

As shown in FIG. 3A, when the optical path modulation optical element 10 is driven such that the first interface 12 of the first electrowetting prism 11 and the second interface 14 of the second electrowetting prism 13 are parallel to the incident surface 10a and the exit surface 10b to make an angle of the first and second interfaces 12 and 14 of the first and second electrowetting prisms 11 and 13 be 0 degree indicating that the first and second interfaces 12 and 14 are parallel to the photoelectric conversion cell array 50, an image incident to the optical path modulation optical element 10 passes through the optical path modulation optical element 10 without shift. Therefore, in this case, the same image as in the case where the optical path modulation optical element 10 is not used is acquired. That is, a color image which has passed through R, G, B, R, and G filter elements 30R, 30G, 30B, 30R, and 30G may be detected as the color image information I1 of an R, G, B, R, and G arrangement as shown in the bottom of FIG. 3A by corresponding photoelectric conversion cells 51.

As shown in FIG. 3B, when the optical path modulation optical element 10 is driven such that the first interface 12 of the first electrowetting prism 11 and the second interface 14 of the second electrowetting prism 13 are inclined by an angle against the incident surface 10a and the exit surface 10b, an image incident to the optical path modulation optical element 10 is refracted and shifted. That is, incident light is refracted by the inclined angle of the first interface 12 of the first electrowetting prism 11 and the second interface 14 of the second electrowetting prism 13 to shift the incident light in a refracted direction and deliver the shifted incident light to the photoelectric conversion cell array 50. Therefore, information on the same incident image as in the case where the optical path modulation optical element 10 is not used may be obtained, but an image is shifted in the refracted direction. In this case, when an angle of each of the first and second interfaces 12 and 14 of the first and second electrowetting prisms 11 and 13 is electrically adjusted to shift the incident image by one pixel of the color filter 30, information on the same incident image is obtained, and an image shifted by one pixel of the color filter 30 is obtained. Therefore, as shown in the bottom of FIG. 3B, the shifted image passes through G, B, R, G, and B filter elements 30G, 30B, 30R, 30G, and 30B of the color filter 30, and color image information 12 of an G, B, R, G, and B arrangement may be acquired by corresponding photoelectric conversion cells 51. That is, the same result as the color filter 30 is mechanically moved by one pixel may be obtained.

According to the image acquisition apparatus as described above, by electrically controlling the optical path modulation optical element 10 to shift an optical path of an incident image, e.g., shift the same incident image by one pixel, images are acquired two or more times in a time division manner and combined. Therefore, as shown in FIG. 12, which is described below, a high-resolution image having improved color resolution and improved total resolution may be acquired.

Figure 12:
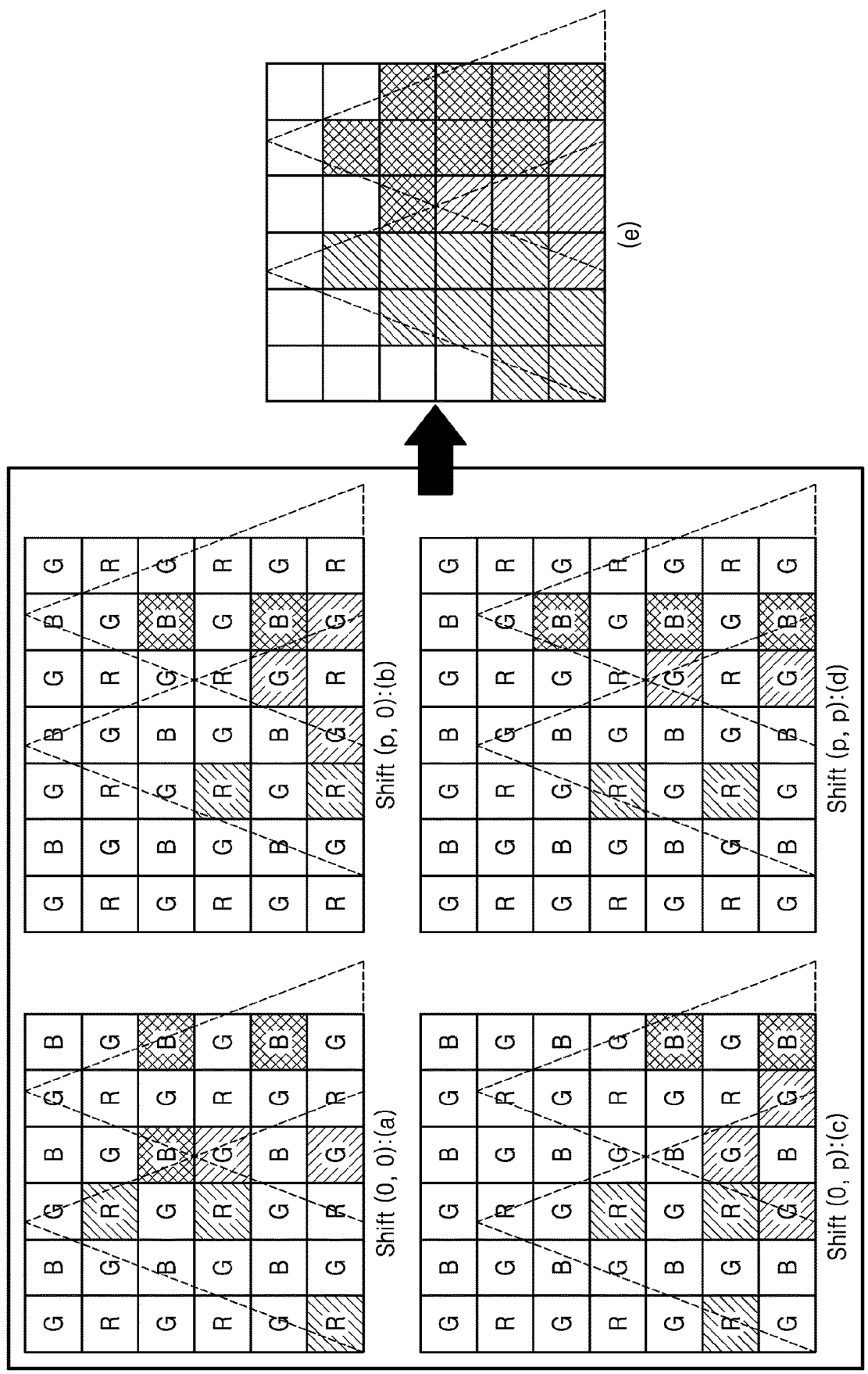
FIG. 12 illustrates an operation of acquiring the image of FIG. 11 by using an image acquisition apparatus according to an exemplary embodiment.

For example, referring to FIG. 12, when a moved amount of an incident position of an image on the color filter 30 is p, an image located at a position (0, 0) may be moved to at least one of positions (p, 0), (0, p), and (p, p) by adjusting each of the first and second interfaces 12 and 14 of the first and second electrowetting prisms 11 and 13. That is, an image may be shifted by one pixel in at least one of a horizontal direction, e.g., an x-axis direction, and a vertical direction, e.g., a y-axis direction. When the moved amount by one pixel is p, the image may be shifted by one pixel in the x-axis direction or the y-axis direction ((0, 0)→(p, 0) or ((0, 0)→(0, p)) to acquire image information for each color from two positions (((0, 0) and (p, 0) or (0, p)) in a time division manner or shifted by one pixel in the x-axis direction and the y-axis direction ((0, 0)→(p, 0), (0, p), and (p, p)) to acquire image information for each color from four positions (((0, 0), (p, 0), (0, p), and (p, p)) in a time division manner. However, the present embodiment is not limited to shifting an image by one pixel in at least one of the horizontal direction, e.g., the x-axis direction, and the vertical direction, e.g., the y-axis direction, and a color image may be obtained by acquiring image information for each color from a plurality of positions in a time division manner and combining the acquired image information for each color while shifting an image in one pixel unit or a unit of a plurality of pixels within a range of a plurality of pixels.

Hereinafter, various exemplary embodiments of an optical configuration of an image acquisition apparatus are described.

Figure 4A:
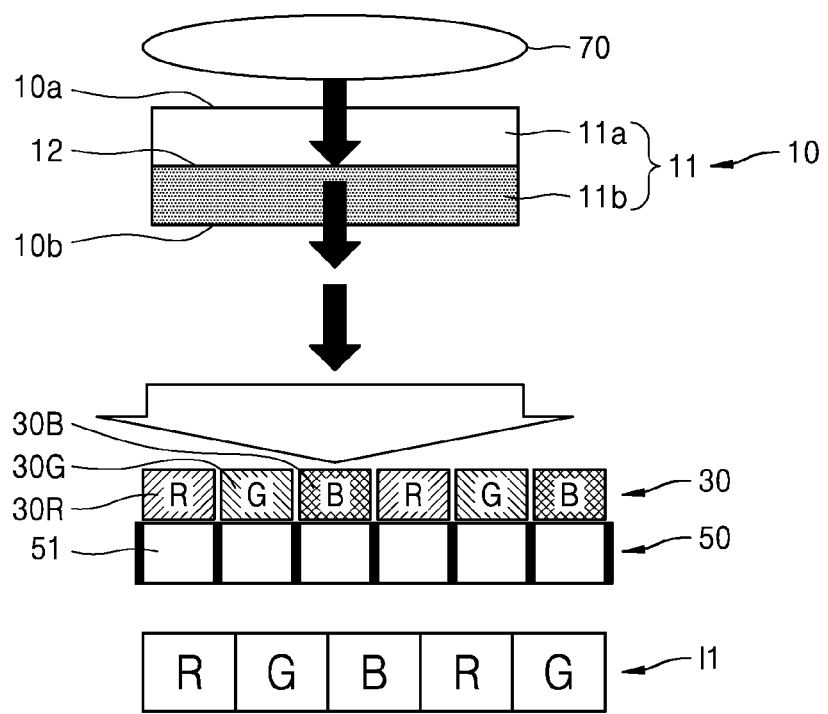
FIGS. 4A and 4B illustrate an image acquisition apparatus, according to another exemplary embodiment.
Figure 4B:
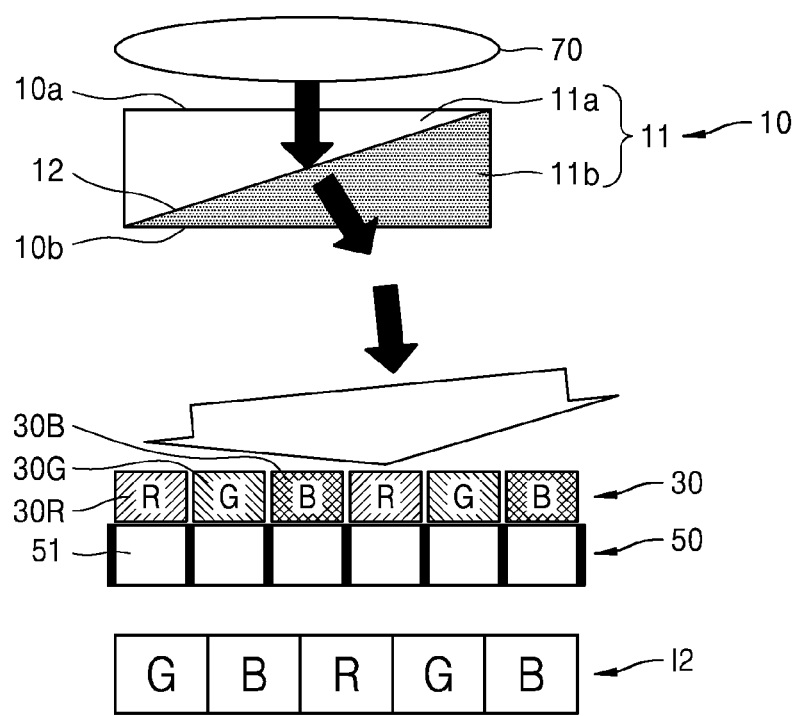

FIGS. 4A and 4B illustrate an image acquisition apparatus, according to another exemplary embodiment. The image acquisition apparatus according to the present exemplary embodiment differs from the image acquisition apparatus described with reference to FIGS. 2 through 3B in that the optical path modulation optical element 10 includes one electrowetting prism, e.g., the first electrowetting prism 11.

As such, as shown in FIG. 4A, when only the first electrowetting prism 11 is applied as the optical path modulation optical element 10, if the optical path modulation optical element 10 is driven such that the first interface 12 of the first electrowetting prism 11 is parallel to the incident surface 10a and the exit surface 10b of the optical path modulation optical element 10, an image incident to the optical path modulation optical element 10 passes through the optical path modulation optical element 10 without being shifted and input to R, G, B, R, and G filter elements 30R, 30G, 30B, 30R, and 30G of the color filter 30. Accordingly, a color image which has passed through the R, G, B, R, and G filter elements 30R, 30G, 30B, 30R, and 30G may be acquired as the color image information I1 of an R, G, B, R, and G arrangement by corresponding photoelectric conversion cells 51. In addition, as shown in FIG. 4B, if the optical path modulation optical element 10 is driven such that the first interface 12 of the first electrowetting prism 11 is inclined from the incident surface 10a and the exit surface 10b of the optical path modulation optical element 10, an image incident to the optical path modulation optical element 10 is refracted by a certain angle, thereby arriving at the photoelectric conversion cell array 50 by being shifted. When an inclination angle of the first interface 12 of the first electrowetting prism 11 is controlled such that the image which has passed through the optical path modulation optical element 10 is shifted by one pixel on the color filter 30, the image is shifted by one pixel and input to G, B, R, G, and B filter elements 30G, 30B, 30R, 30G, and 30B of the color filter 30. Accordingly, the image which has passed through the G, B, R, G, and B filter elements 30G, 30B, 30R, 30G, and 30B of the color filter 30 may be acquired as the color image information I2 of a G, B, R, G, and B arrangement by corresponding photoelectric conversion cells 51. Herein, as shown in FIG. 4B, when an image is shifted by applying one electrowetting prism as the optical path modulation optical element 10, compared with light incident to the incident surface 10a of the optical path modulation optical element 10, light output from the exit surface 10b of the optical path modulation optical element 10 may have a slight tilt. However, since a degree of the tilt is insignificant or low, image information for each color may be acquired in a state of being shifted by one pixel on the color filter 30 without image distortion.

FIGS. 5A and 5B and 6A and 6B illustrate image acquisition apparatuses, according to other exemplary embodiments. The image acquisition apparatuses according to the present exemplary embodiments differ from the image acquisition apparatuses according to the above-described exemplary embodiments in that an active liquid crystal element configured to shift or return an image by turning on or off a voltage to be applied to a liquid crystal layer is used instead of using an electrowetting prism as the optical path modulation optical element 10. For the active liquid crystal element applicable to the optical path modulation optical element 10, a hologram-type liquid crystal element or a beam-steering liquid crystal element may be applied so as to perform the same or similar role as the electrowetting prism.

The hologram-type liquid crystal element is configured to operate as a hologram element by modulating a liquid crystal arrangement. For example, the hologram-type liquid crystal element may not operate as a hologram element in a voltage-off state and may operate as a hologram element in a voltage-on state to shift an image on the color filter 30 in, for example, a pixel unit.

The beam-steering liquid crystal element is configured to operate as a beam-steering element by changing a refractive index according to a voltage applied to a liquid crystal as in a prism to change a traveling direction of an incident beam. For example, the beam-steering liquid crystal element may not operate as a beam-steering element in a voltage-off state and may operate as a beam-steering element in a voltage-on state to shift an image on the color filter 30 in, for example, a pixel unit.

In correspondence with FIGS. 3A and 3B, FIGS. 5A and 5B show that first and second active liquid crystal elements 110 and 130 are provided as the optical path modulation optical element 10 instead of the first and second electrowetting prisms 11 and 13. In this case, for the first and second active liquid crystal elements 110 and 130, the hologram-type liquid crystal element, the beam-steering liquid crystal element, or the like may be applied.

In correspondence with FIGS. 4A and 4B, FIGS. 6A and 6B show that one active liquid crystal element, e.g., the first active liquid crystal element 110, is provided as the optical path modulation optical element 10 instead of the one electrowetting prism. In this case, for the first active liquid crystal element 110, the hologram-type liquid crystal element, the beam-steering liquid crystal element, or the like may be applied.

Figure 7A:
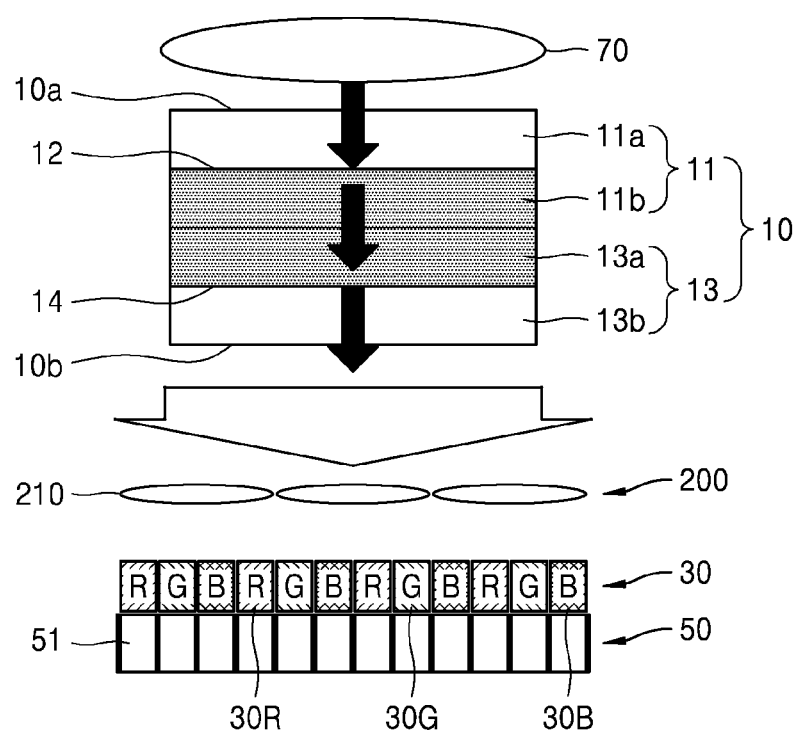
FIGS. 7A and 7B illustrate an image acquisition apparatus, according to another exemplary embodiment.
Figure 7B:
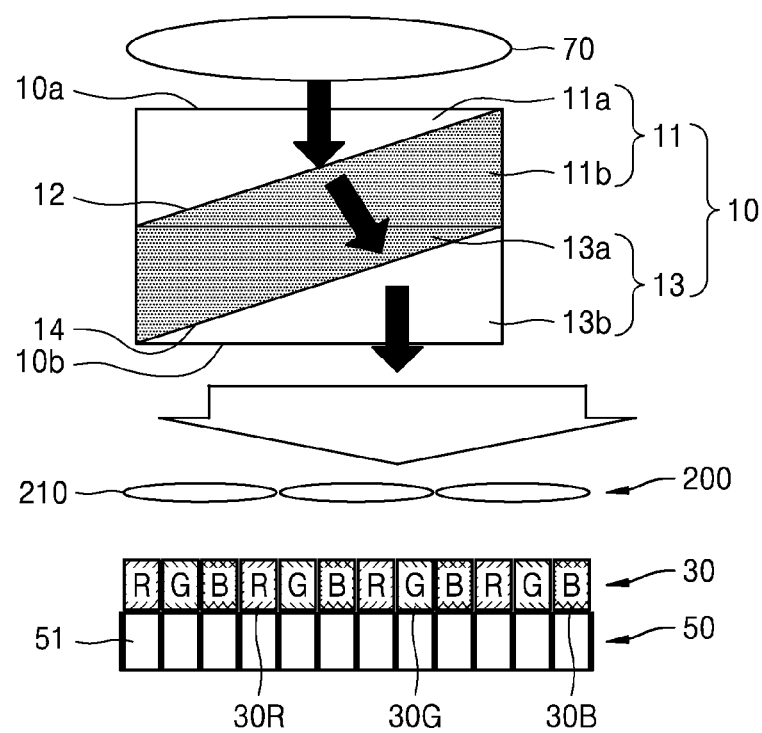

FIGS. 7A and 7B illustrate an image acquisition apparatus, according to another exemplary embodiment, wherein FIG. 7A illustrates an operation of passing an image through the optical path modulation optical element 10 without shifting the image, and FIG. 7B illustrates an operation in which the optical path modulation optical element 10 shifts an image.

Figure 5A:
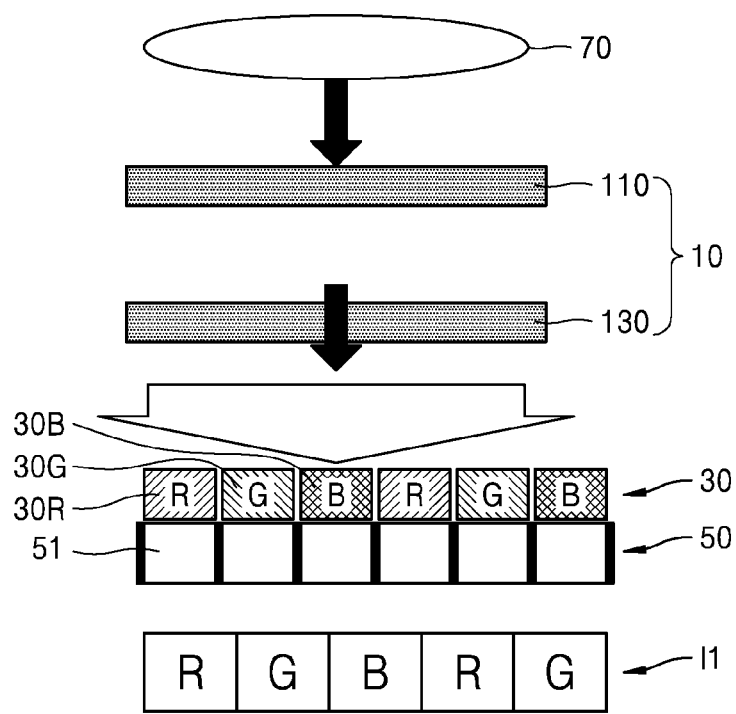
FIGS. 5A and 5B illustrate an image acquisition apparatus, according to another exemplary embodiment.
Figure 5B:
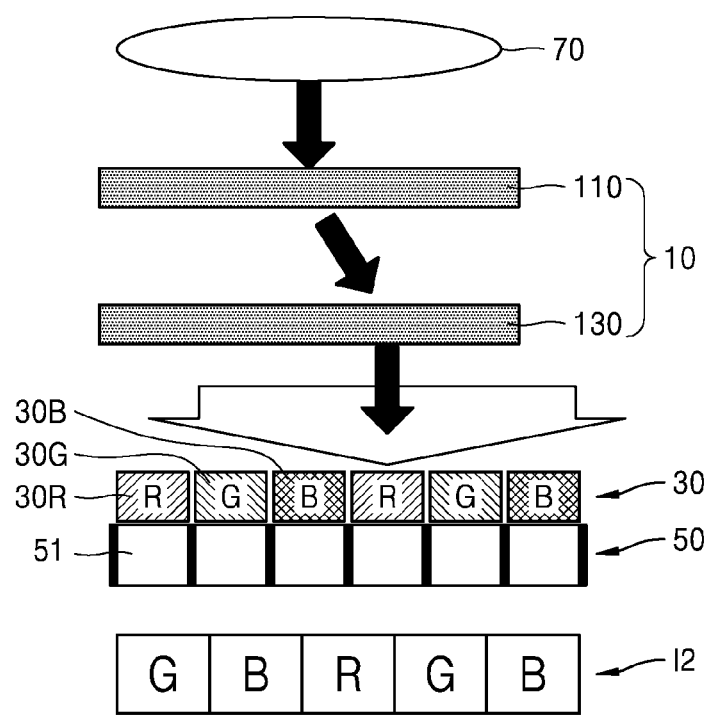
Figure 6A:
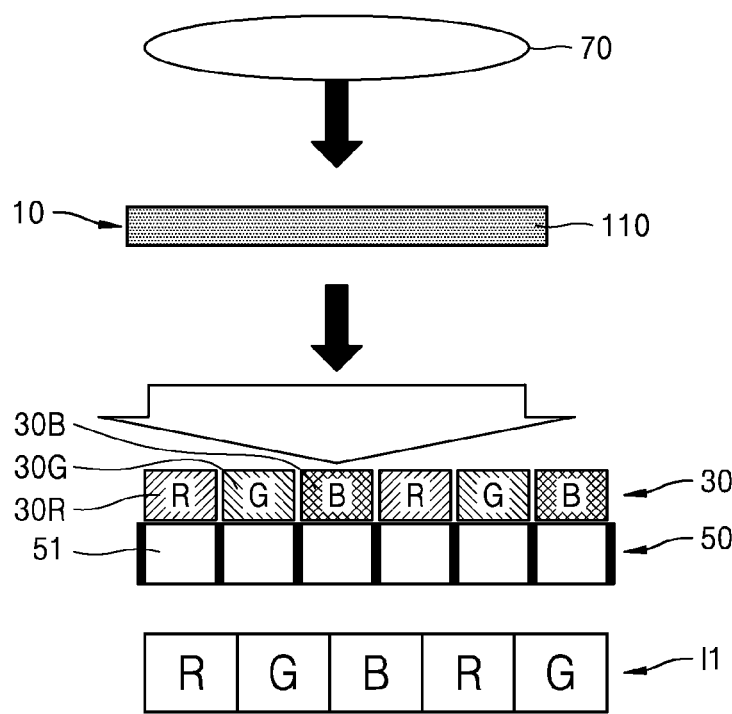
FIGS. 6A and 6B illustrate an image acquisition apparatus, according to another exemplary embodiment.
Figure 6B:
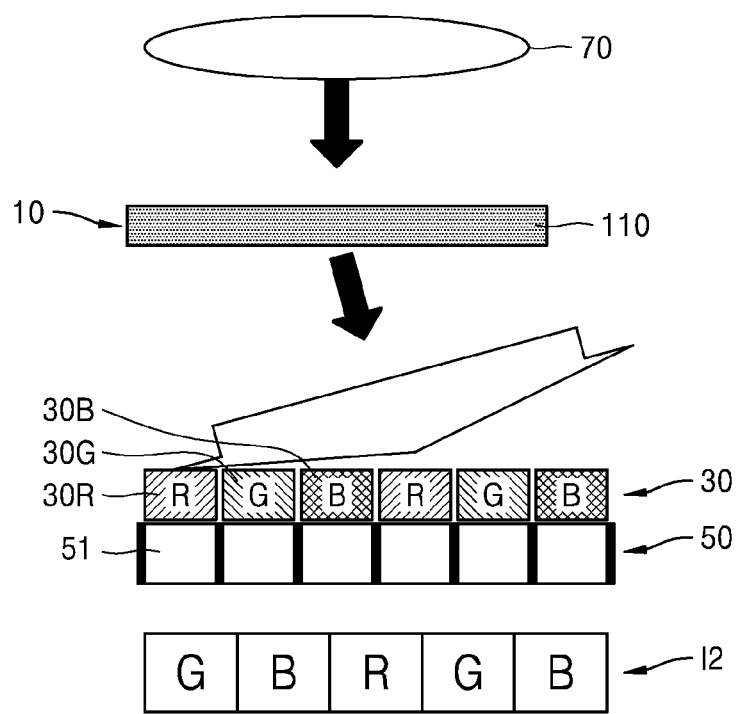

Referring to FIGS. 7A and 7B, compared with the exemplary embodiments described with reference to FIGS. 2 through 6B, the image acquisition apparatus according to the present exemplary embodiment further includes a microlens array 200 between the main lens 70 and the color filter 30. FIGS. 7A and 7B illustrate a case where the microlens array 200 is disposed between the optical path modulation optical element 10 and the color filter 30, the optical path modulation optical element 10 including the first and second electrowetting prisms 11 and 13. However, the optical path modulation optical element 10 of FIGS. 7A and 7B may include the first electrowetting prism 11 as shown in FIGS. 4A and 4B, the first and second active liquid crystal elements 110 and 130 as shown in FIGS. 5A and 5B, or the first active liquid crystal element 110 as shown in FIGS. 6A and 6B instead of the first and second electrowetting prisms 11 and 13.

As shown in FIGS. 7A and 7B, when the image acquisition apparatus further includes the microlens array 200 in addition to the main lens 70, since a plurality of images traveling from the main lens 70 towards respective directions may be transferred to the image sensor 150 by respective microlenses 210, the image acquisition apparatus may store a light field. Therefore, the image acquisition apparatus may be implemented as a light-field camera, which obtains a plurality of parallax images by using one camera, or the like.

Herein, according to a scheme of storing a light field, the microlens array 200 may be disposed next to the main lens 70 that is an imaging lens and before the image sensor 150 to store information depending on a direction of light in a 2D form and then readjust an image focus through post-processing, and during the post-processing, depth information and the like of a captured image may be extracted through three-dimensional (3D) information computation. Since this scheme acquires information depending on a direction of light by matching a plurality of color filter elements 30R, 30G, and 30B and a plurality of photoelectric conversion cells 51 with one microlens 210, resolution may be low.

However, according to the image acquisition apparatus according to the present exemplary embodiment, since an image is shifted by one pixel in a time division manner to obtain image information for each color of a non-shifted image and image information for each color of a shifted image and to acquire 3D image information by combining the obtained image information for each color, the acquired 3D image information may have improved color resolution and improved total resolution. Therefore, a decrease in resolution may be avoided or reduced while acquiring 3D image information in the light field scheme.

Therefore, according to the image acquisition apparatus according to the present exemplary embodiment, even when 3D image information of an image is acquired, a 3D image having higher resolution than that in the existing light field scheme may be acquired.

Figure 8A:
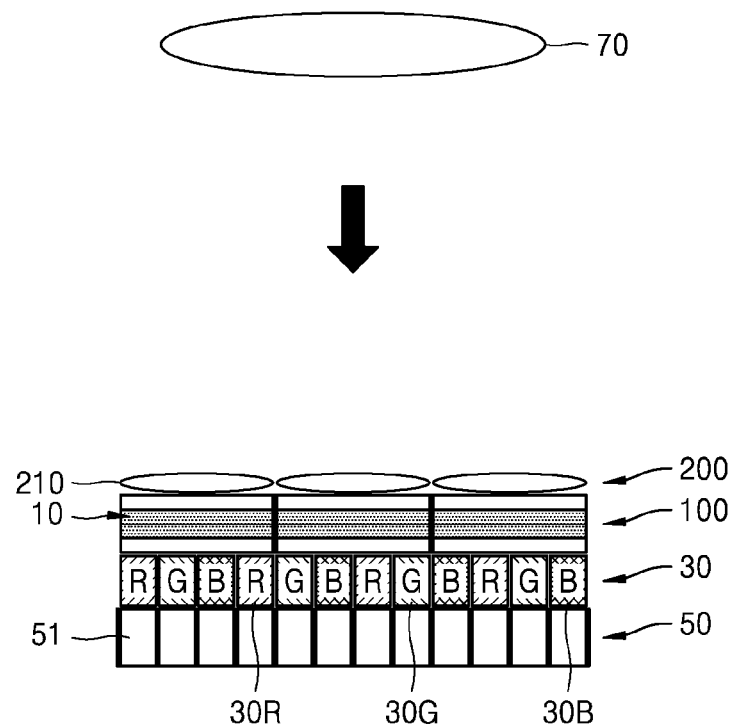
FIGS. 8A and 8B illustrate an image acquisition apparatus, according to another exemplary embodiment.
Figure 8B:
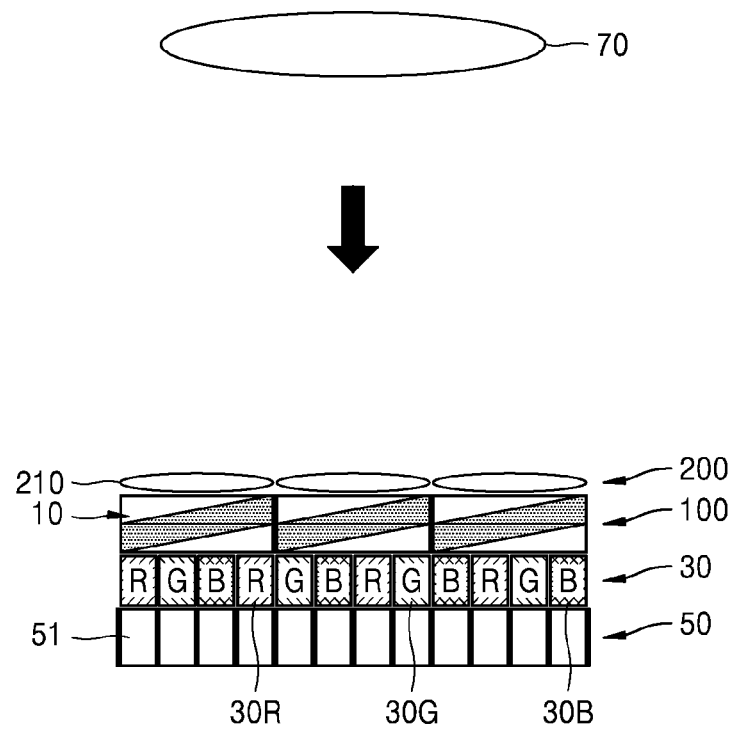
Figure 9:
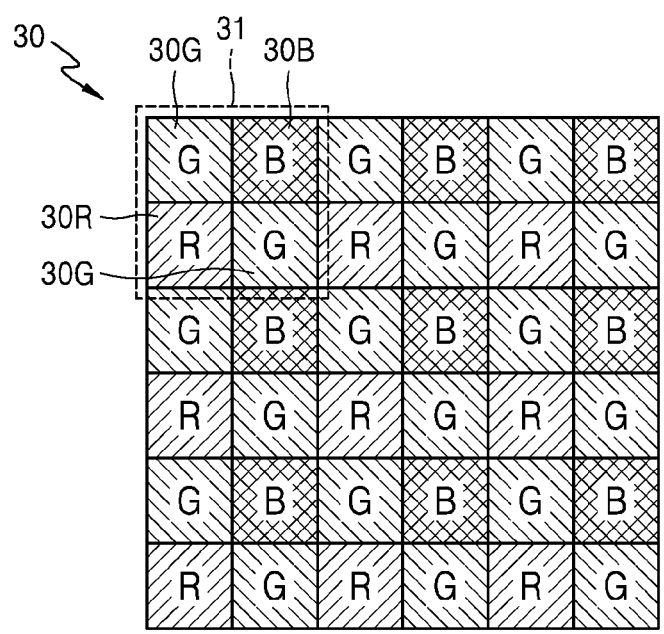
FIG. 9 illustrates an arrangement of color filter elements in a color filter applied to an image acquisition apparatus, according to an exemplary embodiment.

FIGS. 8A and 8B illustrate an image acquisition apparatus, according to another exemplary embodiment, wherein FIG. 8A illustrates an operation of passing an image through the optical path modulation optical element 10 without shifting the image, and FIG. 8B illustrates an operation in which the optical path modulation optical element 10 shifts an image.

Referring to FIGS. 8A and 8B, the image acquisition apparatus according to the present exemplary embodiment differs from the image acquisition apparatus of FIGS. 7A and 7B in that a plurality of optical path modulation optical elements 10 are provided as an optical path modulation optical element array 100. FIGS. 8A and 8B illustrate a case where each optical path modulation optical element 10 includes the first electrowetting prism 11 and the second electrowetting prism 13. However, in FIGS. 8A and 8B, each optical path modulation optical element 10 may include the first electrowetting prism 11 as shown in FIGS. 4A and 4B, the first and second active liquid crystal elements 110 and 130 as shown in FIGS. 5A and 5B, or the first active liquid crystal element 110 as shown in FIGS. 6A and 6B instead of the first and second electrowetting prisms 11 and 13.

As shown in FIGS. 8A and 8B, when the plurality of optical path modulation optical elements 10 are provided as the optical path modulation optical element array 100, the plurality of optical path modulation optical elements 10 may be arranged so as to one-to-one correspond to the plurality of microlenses 210 of the microlens array 200. Although FIGS. 8A and 8B show a case where the optical path modulation optical element array 100 is disposed between the microlens array 200 and the color filter 30, the optical path modulation optical element array 100 may be disposed between the main lens 70 and the microlens array 200.

As shown in FIGS. 8A and 8B, when the plurality of optical path modulation optical elements 10 are provided as the optical path modulation optical element array 100 to correspond to the microlens array 200, a plurality of images traveling in a plurality of directions by the main lens 70 may be respectively incident to the plurality of microlenses 210, shifted by, for example, one pixel, in a time division manner by the plurality of optical path modulation optical elements 10 corresponding to the plurality of microlenses 210 and incident to corresponding regions of the color filter 30. Color images which have passed through color filter elements 30R, 30G, and 30B in the corresponding regions of the color filter 30 may be acquired as image information for each direction and for each color by the corresponding photoelectric conversion cells 51. Therefore, when the acquired image information is combined, 3D image information having improved color resolution and improved total resolution may be acquired.

Figure 10:
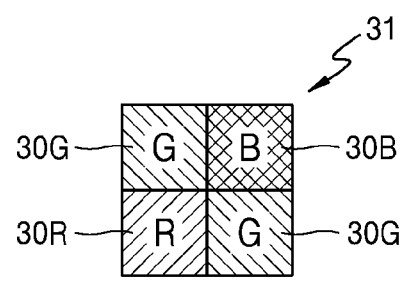
FIG. 10 illustrates a basic unit of the color filter elements of FIG. 9.

FIG. 9 illustrates an arrangement of color filter elements 30R, 30G, and 30B in the color filter 30 applied to an image acquisition apparatus, according to an exemplary embodiment. FIG. 10 illustrates a basic unit 31 of the color filter elements 30R, 30G, and 30B of FIG. 9. FIGS. 9 and 10 illustrate a case where the color filter elements 30R, 30G, and 30B in the color filter 30 are arranged in the Bayer pattern.

Referring to FIGS. 9 and 10, the basic unit 31 of the color filter elements 30R, 30G, and 30B in the color filter 30 includes, for example, four color filter elements including one R filter element 30R, two G filter element 30G, and one B filter element 30B, and a plurality of basic units 31 including the four color filter elements may be two-dimensionally arranged. The R filter element 30R and a corresponding photoelectric conversion cell 51 form one R pixel of the image sensor 150. The G filter element 30G and a corresponding photoelectric conversion cell 51 form one G pixel of the image sensor 150. The B filter element 30B and a corresponding photoelectric conversion cell 51 form one B pixel of the image sensor 150.

Figure 11:
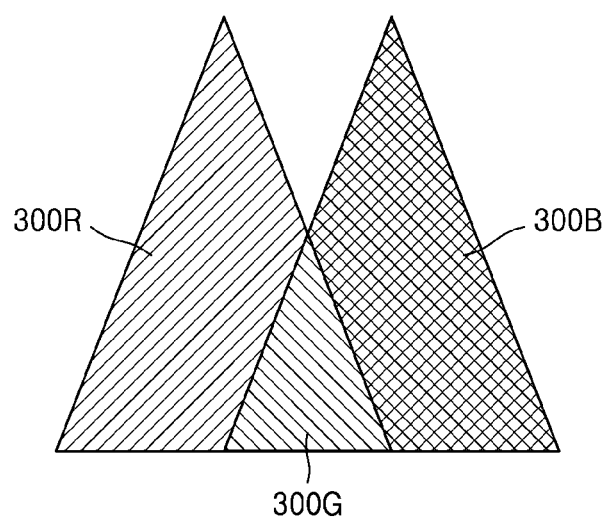
FIG. 11 illustrates an image to be acquired by an image acquisition apparatus according to an exemplary embodiment.

FIG. 11 illustrates an image to be acquired by an image acquisition apparatus according to an exemplary embodiment. FIG. 12 illustrates an operation of acquiring the image of FIG. 11by using the image acquisition apparatus according to an exemplary embodiment. FIG. 12 illustrates an operation of acquiring an image when the color filter 30 of the Bayer pattern is applied. When the color filter 30 applied to the image acquisition apparatus has other color filter elements, an arrangement of color image portions acquired in the image acquisition operation may vary.

As shown in FIG. 11, when an image including an R image portion 300R, a G image portion 300G, and a B image portion 300B is incident to the color filter 30, if the image is not shifted by the optical path modulation optical element 10, i.e., shifted by (0, 0), first color image information is acquired by the image sensor 150 as shown in a part (a) of FIG. 12. The first color image information corresponds to information obtained by hatched color pixels in the part (a) of FIG. 12.

When the image is moved by (p, 0) by being shifted by one pixel p in a horizontal-axis direction, i.e., the x-axis direction, by the optical path modulation optical element 10, second color image information is acquired by the image sensor 150 as shown in a part (b) of FIG. 12. The second color image information corresponds to information obtained by hatched color pixels in the part (b) of FIG. 12.

When the image is moved by (0, p) by being shifted by one pixel p in a vertical-axis direction, i.e., the y-axis direction, by the optical path modulation optical element 10, third color image information is acquired by the image sensor 150 as shown in a part (c) of FIG. 12. The third color image information corresponds to information obtained by hatched color pixels in the part (c) of FIG. 12.

When the image is moved by (p, p) by being shifted by one pixel p in the horizontal-axis direction, i.e., the x-axis direction, and the vertical-axis direction, i.e., the y-axis direction, by the optical path modulation optical element 10, fourth color image information is acquired by the image sensor 150 as shown in a part (d) of FIG. 12. The fourth color image information corresponds to information obtained by hatched color pixels in the part (d) of FIG. 12.

Therefore, when the first color image information, the second color image information, the third color image information, and the fourth color image information are acquired in a time division manner and are combined, an acquired image as shown in a part (e) of FIG. 12 is obtained.

When the incident image of FIG. 11 is compared with the acquired image in the part (e) of FIG. 12, there is insignificant or low loss of color resolution, and the acquired image is obtained with resolution close to that of the incident image.

Therefore, according to the image acquisition method according to the present exemplary embodiment, even when the color filter 30 having an array of a plurality of types of color filter elements 30R, 30G, and 30B, e.g., the color filter elements 30R, 30G, and 30B arranged in the Bayer pattern, is applied, a loss of color resolution and total resolution may not occur, and thus, a high-resolution image may be acquired.

Although it has been described that a color image is acquired by acquiring image information in a time division manner while shifting an image to (0, 0), (p, 0), (0, p), and (p, p) and combining the acquire image information, the present exemplary embodiment is not limited thereto. According to the image acquisition method according to the present exemplary embodiment, a color image may be acquired by acquiring image information in a time division manner while shifting and returning an image position at least once in other various schemes and combining the acquired image information.

That is, image information for each color may be acquired by detecting light which has passed through the color filter 30 by using the photoelectric conversion cell array 50 in pixel units while electrically controlling the optical path modulation optical element 10 to change an incident position of the image on the color filter 30 having an arrangement of a plurality of types of color filter elements 30R, 30G, and 30B. In this case, image information for each color may be acquired from a plurality of positions in a time division manner by using the photoelectric conversion cell array 50 while changing a position of an image on the color filter 30 at least once by using optical path modulation according to an electrical control of the optical path modulation optical element 10. Therefore, a high-resolution color image may be acquired by combining the image information for each color acquired from the plurality of positions in a time division manner.

An image acquisition operation of the image acquisition apparatus according to the present exemplary embodiment has been described by illustrating a case where the color filter 30 has the Bayer pattern including an R, G, G, and B arrangement as shown in FIG. 9. However, as described above, color filters having various color element pattern arrangements may be applied to the image acquisition apparatus according to the present exemplary embodiment. For example, the image acquisition apparatus according to the present exemplary embodiment may include any one of a color filter 130 of an RGBW pattern and a color filter 230 of an RGB pattern shown in FIGS. 13 and 14 as the color filter 30. Alternatively, the image acquisition apparatus according to the present exemplary embodiment may include any one of color filters including Y, M, and C filter elements instead of R, G, and B filter elements in FIGS. 13 and 14 as the color filter 30. That is, the color filters 130 and 230 of FIGS. 13 and 14 may include a YMCW pattern or a YMC pattern.

Figure 13:
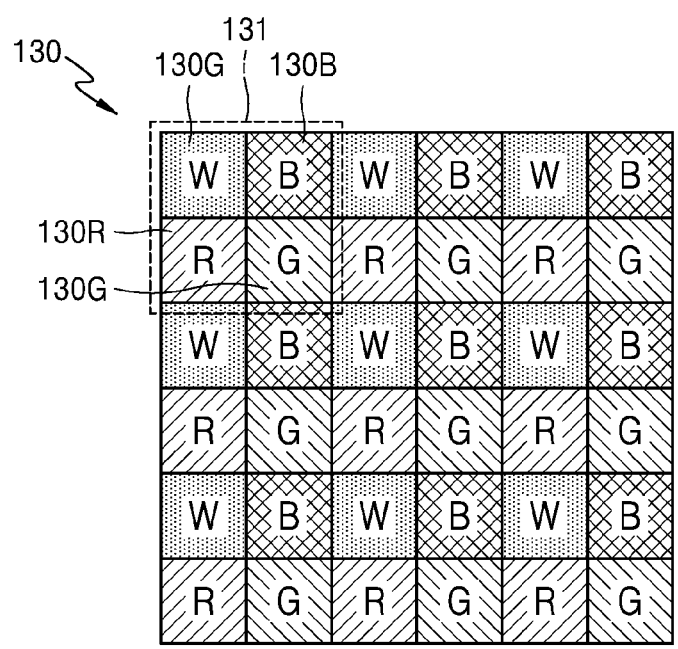
FIG. 13 illustrates an arrangement of color filter elements in a color filter of a red, green, blue, and white (RGBW) pattern.

FIG. 13 illustrates an arrangement of color filter elements 130R, 130G, 130B, and 130W in the color filter 130 of the RGBW pattern.

Referring to FIG. 13, a basic unit 131 of the color filter elements 130R, 130G, 130B, and 130W of the color filter 130 having the RGBW pattern may include four color filter elements including, for example, an R filter element 130R, a G filter element 130G, a B filter element 130B, and a W filter element 130W, i.e., a transparent element without a color filter, and the color filter 130 may have a form in which a plurality of basic units 131, each including the four filter elements, are two-dimensionally arranged. The color filter 130 having the RGBW pattern corresponds to a color filter in which one G filter element in the color filter 30 of the Bayer pattern is replaced by one W filter element, and may have improved light efficiency.

The R filter element 130R and a corresponding photoelectric conversion cell 51 form an R pixel of the image sensor 150. The G filter element 130G and a corresponding photoelectric conversion cell 51 form a G pixel of the image sensor 150. The B filter element 130B and a corresponding photoelectric conversion cell 51 form a B pixel of the image sensor 150. The W filter element 130W and a corresponding photoelectric conversion cell 51 form a W pixel of the image sensor 150.

Figure 14:
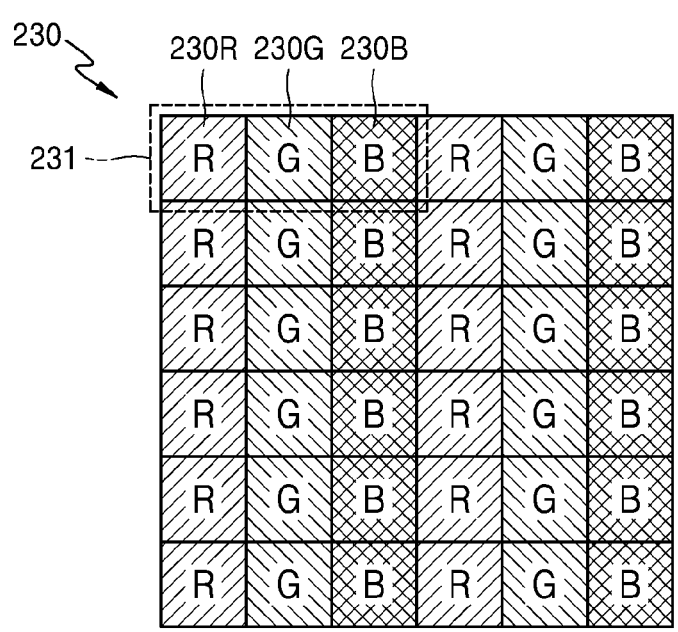
FIG. 14 illustrates an arrangement of color filter elements in a color filter of a red, green, and blue (RGB) pattern.

FIG. 14 illustrates an arrangement of color filter elements 230R, 230G, and 230B in the color filter 230 of the RGB pattern.

Referring to FIG. 14, a basic unit 231 of the color filter elements 230R, 230G, and 230B in the color filter 230 having the RGB pattern may include three color filter elements including, for example, an R filter element 230R, a G filter element 230G, and a B filter element 230B, and the color filter 230 may have a form in which a plurality of basic units 231, each including the three filter elements, are two-dimensionally arranged. The R filter element 230R and a corresponding photoelectric conversion cell 51 form an R pixel of the image sensor 150. The G filter element 230G and a corresponding photoelectric conversion cell 51 form a G pixel of the image sensor 150. The B filter element 230B and a corresponding photoelectric conversion cell 51 form a B pixel of the image sensor 150.

In FIGS. 13 and 14, when Y, M, and C filter elements are applied instead of R, G, and B filter elements, photoelectric conversion cells 51 of the image sensor 50 respectively corresponding to Y, M, and C filter elements form Y, M, and C pixels.

As described above, each of the color filters 30, 130, and 230 applied to the image acquisition apparatuses according to the exemplary embodiments may include any one of a 2D arrangement of color filter element basic units, each including two G filter elements, one B filter element, and one R filter element arranged in the Bayer pattern, a 2D arrangement of color filter element basic units, each including one R filter element, one G filter element, one B filter element, and one W element, a 2D arrangement of color filter element basic units, each including one R filter element, one G filter element, and one B filter element, a 2D arrangement of color filter element basic units including one Y filter element, one M filter element, one C filter element, and one W element, and a 2D arrangement of color filter element basic units, each including one Y filter element, one M filter element, and one C filter element.

Hereinafter, a principle of acquiring a high-resolution color image when the color filter 30, 130, or 230 having an arrangement pattern of various color filter elements is applied to an image acquisition apparatus according to an exemplary embodiment is described.

Figure 15:
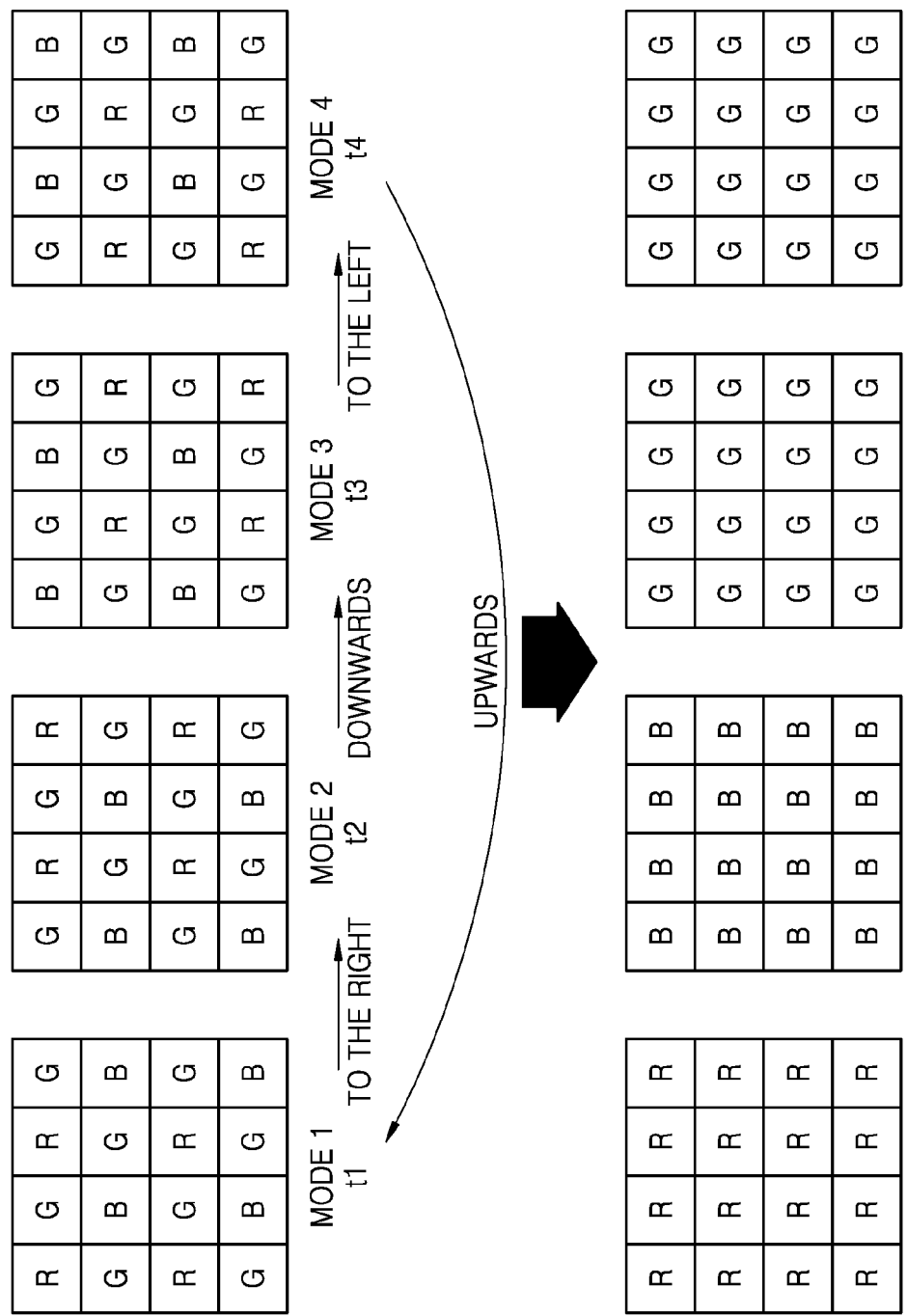
FIG. 15 illustrates an operation of acquiring a high-resolution color image by shifting an image having a color arrangement corresponding to a Bayer pattern based on an operation of an optical path modulation optical element, according to an exemplary embodiment.

FIG. 15 illustrates an operation of acquiring a high-resolution color image by shifting an image having a color arrangement corresponding to the Bayer pattern based on an operation of the optical path modulation optical element 10, according to an exemplary embodiment. The image acquisition operation of FIG. 15 may be applied when an image acquisition apparatus according to an exemplary embodiment includes the color filter 30 of the Bayer pattern as shown in FIG. 9.

Referring to FIG. 15, a case where an image of a mode 1 (t1) is input to the image acquisition apparatus is illustrated. The mode 1 (t1) of FIG. 15 indicates an image incident to the image sensor 150 without being shifted by the optical path modulation optical element 10. A mode 2 (t2) of FIG. 15 indicates an image obtained when the optical path modulation optical element 10 shifts the image of the mode 1 to the right. A mode 3 (t3) of FIG. 15 indicates an image obtained when the optical path modulation optical element 10 shifts the image of the mode 2 downwards. A mode 4 (t4) of FIG. 15 indicates an image obtained when the optical path modulation optical element 10 shifts the image of the mode 3 to the left. When the optical path modulation optical element 10 shifts the image of the mode 4 upwards, the image of the mode 1 is obtained.

When R images of the modes 1, 2, 3, and 4 of FIG. 15, which are acquired in a time division manner, are combined, a color image entirely including R images may be obtained as shown in the lower part of FIG. 15, and when B images of the modes 1, 2, 3, and 4 of FIG. 15, which are acquired in a time division manner, are combined, a color image entirely including B images may be obtained as shown in the lower part of FIG. 15. In addition, when G images of the modes 1 and 2 of FIG. 15, which are acquired in a time division manner, and G images of the modes 3 and 4 of FIG. 15, which are acquired in a time division manner, are separately combined, two color images entirely including G images may be obtained as shown in the lower part of FIG. 15. Therefore, a high-resolution image may be obtained.

Figure 16:
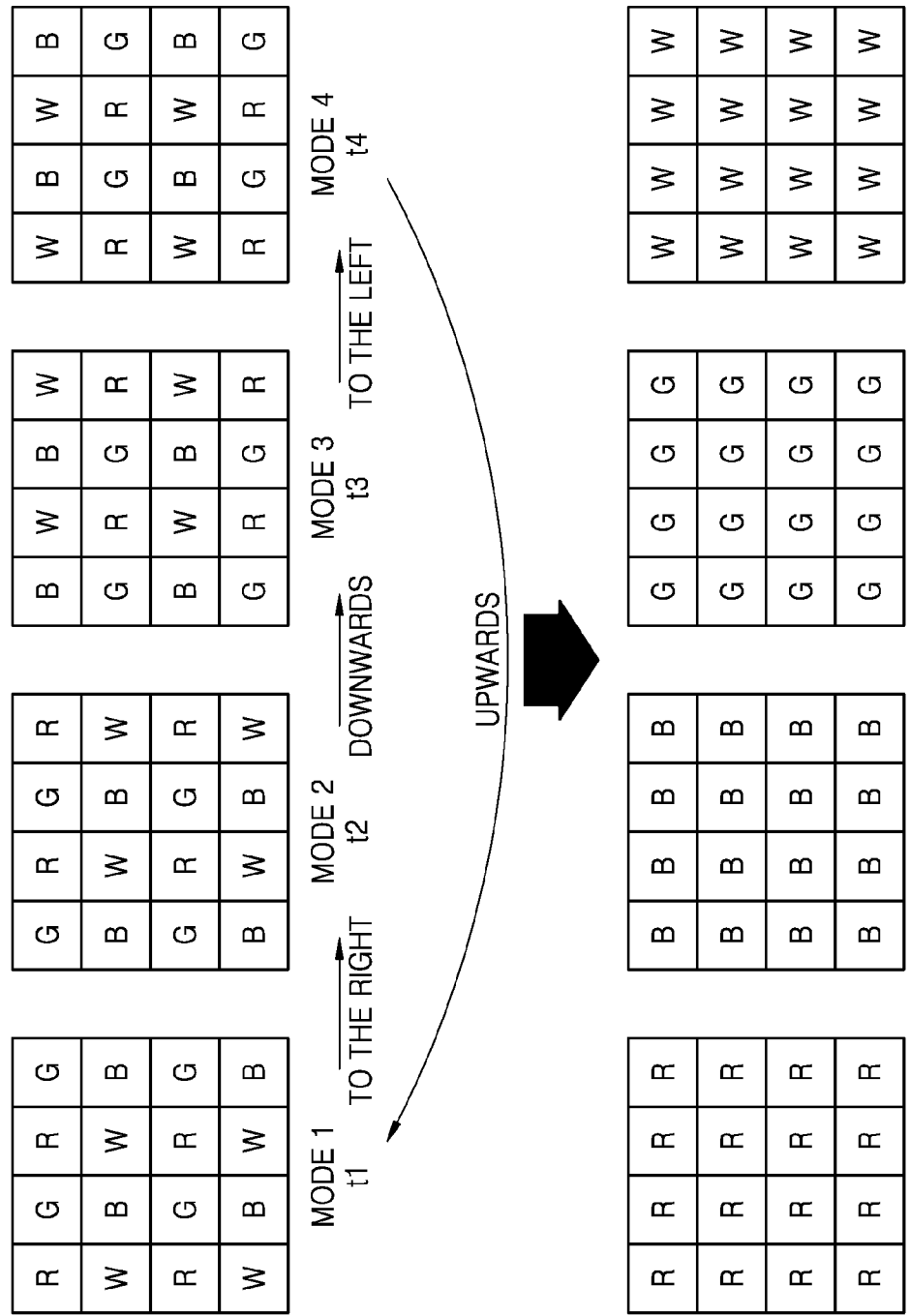
FIG. 16 illustrates an operation of acquiring a high-resolution color image by shifting an image having a color arrangement corresponding to the RGBW pattern based on an operation of the optical path modulation optical element, according to an exemplary embodiment.

FIG. 16 illustrates an operation of acquiring a high-resolution color image by shifting an image having a color arrangement corresponding to the RGBW pattern based on an operation of the optical path modulation optical element 10, according to an exemplary embodiment. The image acquisition operation of FIG. 16 may be applied when an image acquisition apparatus according to an exemplary embodiment includes the color filter 130 of the RGBW pattern as shown in FIG. 13.

Referring to FIG. 16, a case where an image of a mode 1 (t1) is input to the image acquisition apparatus is illustrated. The mode 1 (t1) of FIG. 16 indicates an image incident to the image sensor 150 without being shifted by the optical path modulation optical element 10. A mode 2 (t2) of FIG. 16 indicates an image obtained when the optical path modulation optical element 10 shifts the image of the mode 1 to the right. A mode 3 (t3) of FIG. 16 indicates an image obtained when the optical path modulation optical element 10 shifts the image of the mode 2 downwards. A mode 4 (t4) of FIG. 16 indicates an image obtained when the optical path modulation optical element 10 shifts the image of the mode 3 to the left. When the optical path modulation optical element 10 shifts the image of the mode 4 upwards, the image of the mode 1 is obtained.

When R images, B images, G images, and W images of the modes 1, 2, 3, and 4 of FIG. 16, which are acquired in a time division manner, are respectively combined, a color image entirely including R images, a color image entirely including B images, a color entirely including G images, and a color image entirely including W images may be obtained as shown in the lower part of FIG. 16.

Figure 17:
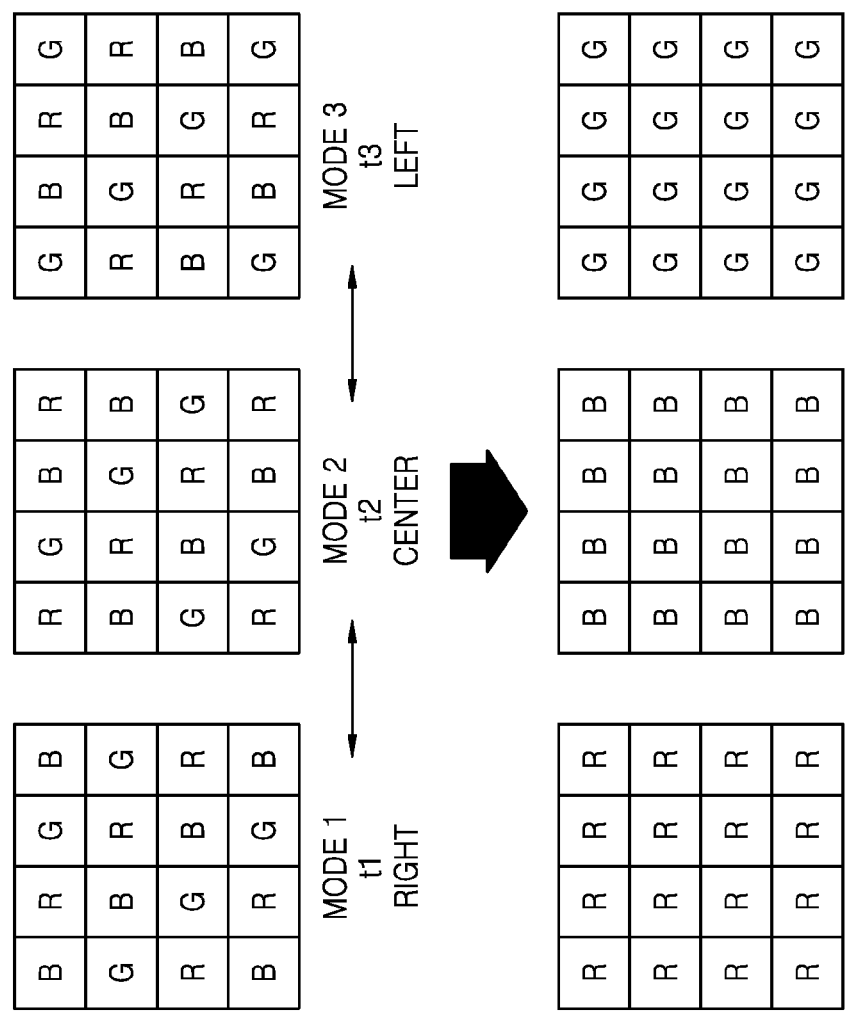
FIG. 17 illustrates an operation of acquiring a high-resolution color image by shifting an image having a color arrangement corresponding to the RGB pattern based on an operation of the optical path modulation optical element, according to an exemplary embodiment.

FIG. 17 illustrates an operation of acquiring a high-resolution color image by shifting an image having a color arrangement corresponding to the RGB pattern based on an operation of the optical path modulation optical element 10, according to an exemplary embodiment. The image acquisition operation of FIG. 17 may be applied when an image acquisition apparatus according to an exemplary embodiment includes the color filter 230 of the RGB pattern as shown in FIG. 14.

Total resolution of an image having a color arrangement corresponding to the RGB pattern may be obtained even when the image is shifted to the left and the right or upwards and downwards, and thus, as shown in FIG. 17, the image may be shifted to the left and the right from the center.

Referring to FIG. 17, a case where an image of a mode 2 (t2) is input to the image acquisition apparatus is illustrated. A mode 1 (t1) of FIG. 17 indicates an image obtained when the optical path modulation optical element 10 shifts the image of the mode 2 to the right. A mode 2 (t2) of FIG. 17 indicates the image incident to the image sensor 150 without being shifted by the optical path modulation optical element 10. A mode 3 (t3) of FIG. 17 indicates an image obtained when the optical path modulation optical element 10 shifts the image of the mode 2 to the left. An image may be shifted from the mode 2 to the mode 1 and from the mode 2 to the mode 3. Alternatively, an image may be shifted from the mode 1 to the mode 2 and from the mode 3 to the mode 2.

Herein, the mode 1 may correspond to an image incident to the image sensor 150 without being shifted by the optical path modulation optical element 10, the mode 2 may correspond to an image obtained by shifting the image of the mode 1 to the left, and the mode 3 may correspond to an image obtained by shifting the image of the mode 2 to the left. The image of the mode 2 is obtained by shifting the image of the mode 3 to the right, and the image of the mode 1 is obtained by shifting the image of the mode 2 to the right.

When the color filter 230 of the RGB pattern is applied to an image acquisition apparatus according to one or more exemplary embodiments, the image acquisition operation may start from any one of the modes 1, 2, and 3, and accordingly, a direction and a sequence of a shift operation for obtaining the images of the modes 1, 2, and 3 may vary.

When R images, G images, and B images of the modes 1, 2, and 3 of FIG. 17, which are acquired in a time division manner, are respectively combined, a color image entirely including R images, a color image entirely including G images, and a color image entirely including B images may be obtained as shown in the lower part of FIG. 17.

Even when a color filter including Y, M, and C filter elements is applied to an image acquisition apparatus according to one or more exemplary embodiments instead of the R, G, and B filter elements of the color filters 130 and 230, the image acquisition operations of FIGS. 16 and 17 may be applied.

According to an image acquisition apparatus and an image acquisition method according to one or more exemplary embodiments, a color image is acquired by shifting an optical path of an image by using an electrically controlled optical path modulation optical element, acquiring image information for each color from a plurality of positions in a time division manner with respect to the same image, and combining the acquired image information for each color, and thus, a high-resolution color image may be acquired.

According to the image acquisition apparatus and the image acquisition method according to one or more exemplary embodiments, image information for each color may be acquired from a plurality of positions in a time division manner by an electrical control of an optical path modulation optical element without mechanically moving an optical element such as a color filter, and thus, accurate image information for each color may be acquired at a high speed without causing problems such as image vibrations caused by mechanical movement of the optical element.

It should be understood that exemplary embodiments described herein should be considered in a descriptive sense only and not for purposes of limitation. Descriptions of features or aspects within each exemplary embodiment should typically be considered as available for other similar features or aspects in other exemplary embodiments.

While one or more exemplary embodiments have been described with reference to the figures, it will be understood by those of ordinary skill in the art that various changes in form and details may be made therein without departing from the spirit and scope as defined by the following claims.

What is claimed is:

1. An image acquisition apparatus comprising:
   a color filter on which a plurality of types of color filter elements are arranged;
   an optical path modulation element configured to shift an incident position of an image on the color filter with time by electrically modulating an optical path of the image;
   one photoelectric conversion cell array configured to acquire image information for each color from a plurality of positions with respect to a same image by detecting, in pixel units, light which has passed through the color filter while the optical path modulation element is electrically controlled to shift the incident position of the same image on the color filter; and
   a signal processor configured to process acquired image information for each color of the image of which the incident position on the color filter is changed with time by the optical path modulation element by using a detection signal of the one photoelectric conversion cell array, and configured to obtain a color image by combining the acquired image information for each color.

2. The image acquisition apparatus of claim 1, wherein the optical path modulation element is configured to shift the incident position of the image on the color filter in one pixel unit, and
   the signal processor is configured to process the acquired image information for each color of the image of which the incident position on the color filter is changed with time in one pixel unit by the optical path modulation element.

3. The image acquisition apparatus of claim 2, further comprising a driver configured to electrically drive the optical path modulation element such that the incident position of the image is changed on the color filter with time.

4. The image acquisition apparatus of claim 1, wherein the optical path modulation element is an electrowetting prism of which an inclination angle of an interface between a first fluid and a second fluid is controlled by an applied voltage, the first fluid and the second fluid having different refractive indices.

5. The image acquisition apparatus of claim 4, wherein an incident surface and an exit surface of the electrowetting prism are parallel to each other.

6. The image acquisition apparatus of claim 4, wherein the electrowetting prism comprises a first electrowetting prism and a second electrowetting prism, each provided with the first and second fluids, and
   the first and second electrowetting prisms are arranged along a traveling direction of the light such that one of the first or second fluids of the first electrowetting prism and one of the first or second fluids of the second electrowetting prism, having a same refractive index, are close to each other.

7. The image acquisition apparatus of claim 6, wherein, when an interface between the first and second fluids in the first electrowetting prism is a first interface, and an interface between the first and second fluids in the second electrowetting prism is a second interface, the first interface and the second interface are parallel to each other.

8. The image acquisition apparatus of claim 1, wherein the optical path modulation element comprises at least one active liquid crystal element configured to shift the light according to an applied voltage.

9. The image acquisition apparatus of claim 8, wherein the at least one active liquid crystal element comprises a first active liquid crystal element disposed along a traveling direction of the light and configured to refract the light according to the applied voltage.

10. The image acquisition apparatus of claim 8, wherein the at least one active liquid crystal element comprises a first active liquid crystal element and a second active liquid crystal element disposed to be spaced apart from each other along a traveling direction of the light and configured to shift the light according to the applied voltage.

11. The image acquisition apparatus of claim 8, wherein the at least one active liquid crystal element comprises at least one of a hologram-type liquid crystal element and a beam-steering liquid crystal element.

12. The image acquisition apparatus of claim 1, further comprising a main lens,
   wherein the optical path modulation element is located between the main lens and the color filter.

13. The image acquisition apparatus of claim 12, further comprising a microlens array between the main lens and the color filter to acquire information of the image corresponding to each direction.

14. The image acquisition apparatus of claim 13, wherein the optical path modulation element is located between the main lens and the microlens array to entirely cover the microlens array.

15. The image acquisition apparatus of claim 13, wherein the optical path modulation element is located between the microlens array and the color filter, and
   an array of a plurality of optical path modulation elements is provided to one-to-one correspond to microlenses in the microlens array.

16. The image acquisition apparatus of claim 1, wherein the color filter comprises at least one of a two-dimensional (2D) arrangement of color filter element basic units, each including two green filter elements, one blue filter element, and one red filter element arranged in a Bayer pattern, a 2D arrangement of color filter element basic units, each including one red filter element, one green filter element, one blue filter element, and one white element, a 2D arrangement of color filter element basic units, each including one red filter element, one green filter element, and one blue filter element, a 2D arrangement of color filter element basic units, each including one yellow filter element, one magenta filter element, one cyan filter element, and one white element, and a 2D arrangement of color filter element basic units, each including one yellow filter element, one magenta filter element, and one cyan filter element.

17. The image acquisition apparatus of claim 16, wherein, in response to the image shifted by the optical path modulation element having a position change amount of p, the optical path modulation element is configured to acquire the image information for each color from a plurality of positions with time by shifting the image by p in at least one of x-axial and y-axial directions, and the signal processor is configured to obtain the color image by combining the image information for each color, which has been acquired from the plurality of positions with time.

18. An image acquisition method comprising:

electrically controlling an optical path modulation element to shift an incident position of an image on a color filter with time on which a plurality of types of color filter elements are arranged;

acquiring, by using one photoelectric conversion cell array, image information for each color from a plurality of positions with respect to a same image by detecting, in pixel units, light which has passed through the color filter while the optical path modulation element is electrically controlled to shift the incident position of the same image on the color filter;

processing acquired image information for each color of the image from a plurality of positions by using the one photoelectric conversion cell array while changing a position of the image on the color filter at least once with time by using optical path modulation according to an electrical control of the optical path modulation element; and acquiring a color image by combining the image information for each color which is acquired with time from the plurality of positions.

19. The image acquisition method of claim 18, wherein the optical path modulation element is configured to shift the incident position of the image on the color filter in one pixel unit.

20. The image acquisition method of claim 18, wherein, in response to the image shifted by the optical path modulation element having a position change amount of p, the image information for each color is acquired from the plurality of positions with time by shifting the image by p in at least one of x- and y-axial directions by using the optical path modulation element, and the color image is acquired by combining the acquired image information.

* * * * *